US00RE44587E

(19) United States
(12) Reissued Patent
Qiu et al.

(10) Patent Number: US RE44,587 E
(45) Date of Reissued Patent: Nov. 12, 2013

(54) DC/DC CONVERTER WITH ADAPTIVE DRIVE VOLTAGE SUPPLY

(71) Applicant: Intersil Americas LLC, Milpitas, CA (US)

(72) Inventors: Weihong Qiu, San Jose, CA (US); Ben Dowlat, San Jose, CA (US); Rami Abou-Hamze, Los Gatos, CA (US); Steven Laur, Raleigh, NC (US)

(73) Assignee: Intersil Americas LLC, Milpitas, CA (US)

(21) Appl. No.: 13/707,148

(22) Filed: Dec. 6, 2012

Related U.S. Patent Documents

Reissue of:
(64) Patent No.: 7,847,531
Issued: Dec. 7, 2010
Appl. No.: 12/563,468
Filed: Sep. 21, 2009

U.S. Applications:
(62) Division of application No. 11/479,675, filed on Jun. 30, 2006, now Pat. No. 7,615,940.

(51) Int. Cl.
*G05F 1/56* (2006.01)

(52) U.S. Cl.
USPC ..... 323/282; 323/271; 323/283; 323/285

(58) Field of Classification Search
USPC ..... 323/271, 282, 283, 285, 351
See application file for complete search history.

(56) References Cited

U.S. PATENT DOCUMENTS

| | | | | |
|---|---|---|---|---|
| 5,949,223 | A * | 9/1999 | Mine | 323/224 |
| 6,057,651 | A | 5/2000 | Usami | |
| 6,147,478 | A | 11/2000 | Skelton et al. | |
| 6,163,115 | A | 12/2000 | Ishizuka | |
| 6,177,768 | B1 | 1/2001 | Kamata et al. | |
| 6,366,064 | B1 | 4/2002 | Reichard | |
| 6,813,170 | B2 | 11/2004 | Yang | |
| 7,034,586 | B2 | 4/2006 | Mehas et al. | |
| 7,145,295 | B1 | 12/2006 | Lee et al. | |
| 7,615,940 | B2 * | 11/2009 | Qiu et al. | 315/308 |
| 7,847,531 | B2 * | 12/2010 | Qiu et al. | 323/282 |
| 2002/0047634 | A1 | 4/2002 | Ito et al. | |
| 2003/0127995 | A1 | 7/2003 | Kramer et al. | |
| 2004/0056607 | A1 | 3/2004 | Henry | |
| 2006/0038547 | A1 * | 2/2006 | Ahmad | 323/284 |
| 2006/0043911 | A1 | 3/2006 | Shao et al. | |
| 2006/0055342 | A1 | 3/2006 | Suzuki et al. | |
| 2006/0103363 | A1 | 5/2006 | Miftakhutdinov | |
| 2006/0197467 | A1 | 9/2006 | Ohta et al. | |
| 2006/0208715 | A1 | 9/2006 | Saeki et al. | |
| 2006/0214647 | A1 | 9/2006 | Ishimaru et al. | |
| 2010/0007320 | A1 * | 1/2010 | Qiu et al. | 323/285 |

* cited by examiner

*Primary Examiner* — Jeffrey Sterrett
(74) *Attorney, Agent, or Firm* — Paul A. Bernkopf; Graybeal Jackson LLP; Bryan A. Santarelli

(57) ABSTRACT

A circuit comprises a first input for receiving a supply voltage and a second input for receiving a sensed current signal from an output of a DC to DC converter. The circuit also includes an output voltage for providing an adjustable drive voltage to a drive circuit. The circuit additionally includes circuitry for adjusting the drive voltage responsive to supply voltage and the sensed current signal.

19 Claims, 7 Drawing Sheets

DC/DC CONVERTER WITH ADAPTIVE DRIVE VOLTAGE SUPPLY

Matter enclosed in heavy brackets [ ] appears in the original patent but forms no part of this reissue specification; matter printed in italics indicates the additions made by reissue.

CROSS-REFERENCE TO RELATED APPLICATIONS

This application is a *reissue of U.S. patent application Ser. No. 12/563,468, filed Sep. 21, 2009, now U.S. Pat. No. 7,847,531, issued Dec. 7, 2010, entitled DC/DC CONVERTER WITH ADAPTIVE DRIVE VOLTAGE SUPPLY, which is a* divisional of U.S. patent application Ser. No. 11/479,675, filed Jun. 30, 2006, *now U.S. Pat. No. 7,615,940, issued Nov. 10, 2009,* [titled] *entitled* GATE DRIVER TOPOLOGY FOR MAXIMUM LOAD EFFICIENCY[, all of which is incorporated herein by reference].

TECHNICAL FIELD

The present invention relates to gate drivers, and more particularly, to gate drivers having a variable supply voltage that provides for maximum load efficiencies over a variety of load current ranges and operating frequencies of switched power supplies.

BACKGROUND

Every electronic circuit is designed to operate off of some supply voltage, which is usually assumed to be constant. A voltage regulator provides the constant DC output voltage and contains circuitry that continuously holds the output voltage at a regulated value regardless of changes in a load current or input voltage. A linear voltage regular operates by using a voltage current source to output a fixed voltage. A control circuit must monitor the output voltage and adjust the current source to hold the output voltage at the desired value.

Circuit designers have limited options for the drive voltages applied to the drive circuits of transistor switches for switched power supplies. They can use the input voltage $V_{in}$ which for many applications will be equal to 12 volts or the system bias voltage VCC which normally comprises 5 volts. If the higher voltage $V_{in}$ is used as the gate driver voltage, there are efficiency losses at the low end of the load current for the switched power supply circuit. If the system voltage VCC is used as the drive voltage, the high end efficiencies are lost for higher load currents. Thus, there is a need for a gate driver topology that provides maximum load efficiency over a wide variety of load current ranges of switched power supplies.

SUMMARY

The present invention disclosed and claimed herein, in one aspect thereof, comprises a circuit including first and second inputs. The first input is for receiving a supply voltage from a voltage supply. A second input receives a sensed current signal from an output of a DC to DC converter. An output of the circuit provides an adjustable drive voltage to a drive circuit of the DC to DC converter. First circuitry adjusts the drive voltage responsive to the input supply voltage and the sensed current signal to provide the adjustable output voltage at the output.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Figure 1:
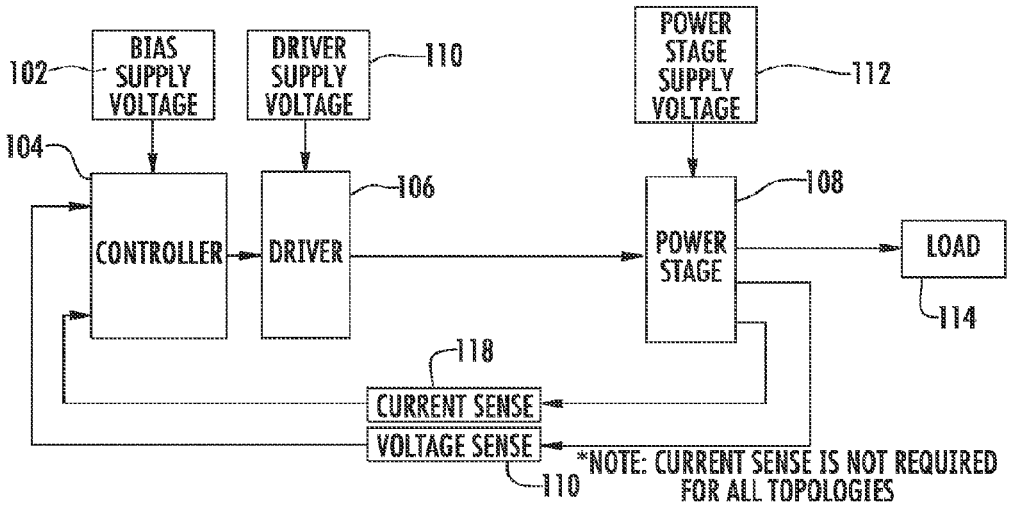
FIG. 1 (PRIOR ART)
FIG. 1 is an illustration of a DC to DC converter topology.

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Referring now to FIG. 1, there is illustrated a basic representation of a DC to DC converter topology. A bias supply voltage 102 provides a chip bias voltage to controller 104. The bias supply voltage 102 voltage is normally indicated as VCC and comprises 5 volts. The controller 104 is responsible for generating control signals to the driver circuit 106. The controller 104 operates responsive to signals provided by voltage sensing circuitry 116 and current sensor circuitry 118. Responsive to the control signals from the controller 104, the driver circuit 106 generates the drive signals to turn on and off the transistors within the power stage 108. The driver circuit 106 is driven by the driver supply voltage 110. The driver supply voltage is normally the input voltage $V_{in}$ but may also be the system bias voltage VCC. The power stage supply input voltage $V_{in}$ 112 is used for providing input voltage for the power stage circuitry 108. The power stage circuitry 108 is connected to a load 114 that loads the DC to DC converter.

Figure 2:
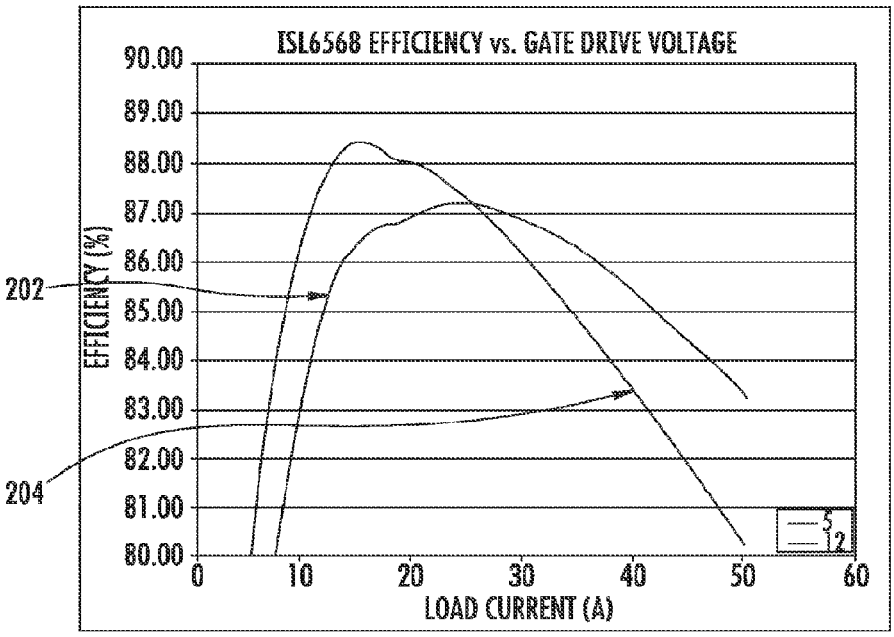
FIG. 2 illustrates the load efficiency versus the gate drive voltage using both the input voltage $V_{in}$ and system voltage VCC for a DC to DC converter.

While the driver supply voltage 110 can come from either of the system voltage input $V_{in}$ from power supply 112 or from the chip bias voltage VCC from the bias supply voltage 102, various limitations are associated with the use of each of the supplies. Referring now to FIG. 2, there is illustrated the limitations associated with each of the system voltage and bias voltage with respect to the power converter efficiency versus the load current. If the power stage supply voltage 112 $V_{in}$ is used as the driver supply voltage 110 as represented by curve 202, the power converter will loose efficiency at low load currents. Similarly, if the bias supply voltage 102 VCC is used as the driver supply voltage 110, the efficiency as indicated by curve 204 are provided. As can be seen, in this configuration, converter efficiencies are greatly decreased at higher load currents using VCC.

Figure 3:
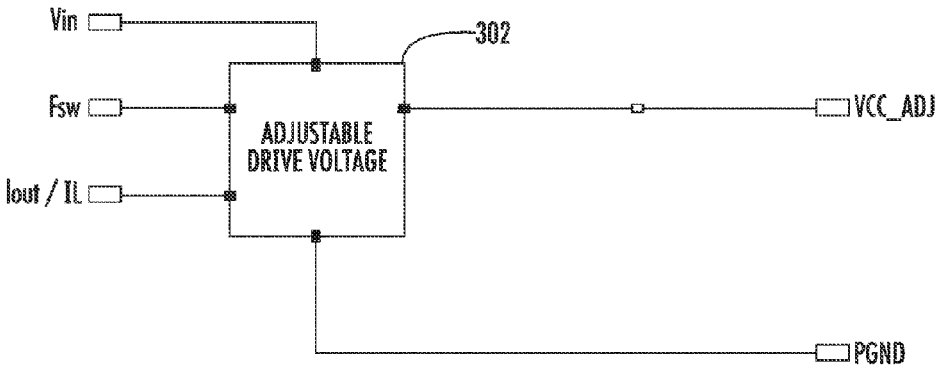
FIG. 3 is a block diagram of a circuit for controlling the drive voltage according to the present disclosure.

One solution for providing better efficiencies at both high end and low end load currents is to utilize a variable gate drive voltage to power the driver circuit 106 using, for example, the circuitry illustrated in the block diagram of FIG. 3. In this case, adaptive drive voltage supply circuitry 302 generates a variable gate drive voltage VCC_ADJ responsive to a number of inputs to the circuitry 302. The adjustable drive voltage is generated responsive to the provided input system voltage $V_{in}$, the output load current of the power stage circuitry 108 $I_{out}I_l$ and/or the switching frequency $F_{sw}$ of the power stage circuitry 108. The adaptive drive voltage supply 302 is additionally connected to ground. While the use of the input voltage $V_{in}$ is illustrated, the bias voltage VCC or another voltage supply may be used as an input.

The proposed operation of the adaptive drive voltage supply 302 throttles the gate to source voltage $V_{gs}$ applied to the power FET switches of the power stage 108 as a function of load or inductor current and/or the switching frequency in the switching converter. In order to achieve the lowest Rdson on in a MOSFET circuit without compromising the reliability of the device, vis-a-vis the rated $V_{gs}$, the gate voltage is driven as high as possible. Lower values of Rdson lower the power dissipated across the transistors and the power stage 108 for a given Rms current. Alternatively, other losses within the power switches of the power stage 108 are dissipated in the gate driver and these losses are related to the drive voltage as well as the gate charge characteristics of the particular FET and the switching frequency of the power stage 108. For any given system, the described scheme will provide the adjustability needed to select the boundary driving voltage for a given load 114 or inductor current range as well as switching frequency changes. Thus, using the load information (inductor or output current, and/or switching frequency of the switches) the gate voltage is modulated by the adaptor drive voltage supply circuitry 302 to achieve the minimum power loss mechanism resulting from the driver and the Rdson from the FET switch itself.

Figure 4:
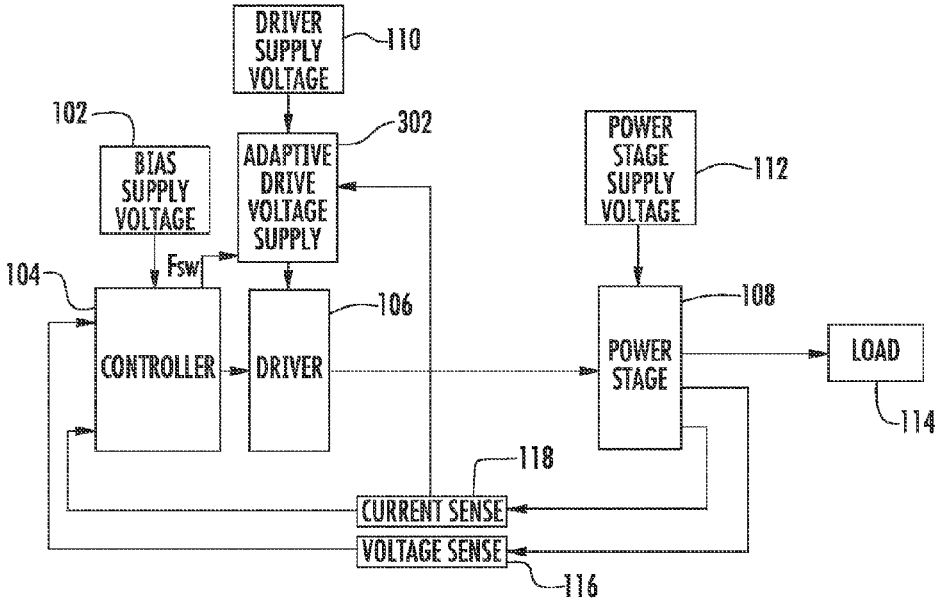
FIG. 4 is an illustration of a DC to DC converter topology including the circuit of FIG. 3.

Referring now to FIG. 4, there is illustrated the adaptive drive voltage supply 302 of FIG. 3 implemented within the DC to DC converter topology. The adaptive drive supply voltage 302 resides between the driver supply voltage 110 and the driver circuit 106. The voltage output by the adaptive drive voltage supply 302 to the driver circuit 106 varies responsive to the detected load current within the power stage 108 that is detected by the current sensor 118 and/or a switching frequency provided by the controller 104. The voltage supplied to the adaptive drive voltage supply 302 may be the input voltage $V_{IN}$ for the power stage supply voltage 112, the voltage from the bias supply voltage 102, or another voltage supply. The current sensor 118 provides an indication of the load current to the adaptive drive voltage supply 302 in order to provide the varied voltage output. The load current varies within the power stage 108 based upon the applied load 114. The driver circuit 106 will generate varied gate drive voltage signals responsive to the variable voltage provided to the driver circuit 106 responsive to the adaptive drive voltage supply 302. These varied gate drive voltage signals will maximize the Rdson utilization within switching transistors within the power stage 108 and provide maximized load efficiency responsive to the particular load 114 being applied to the power stage 108.

Figure 5:
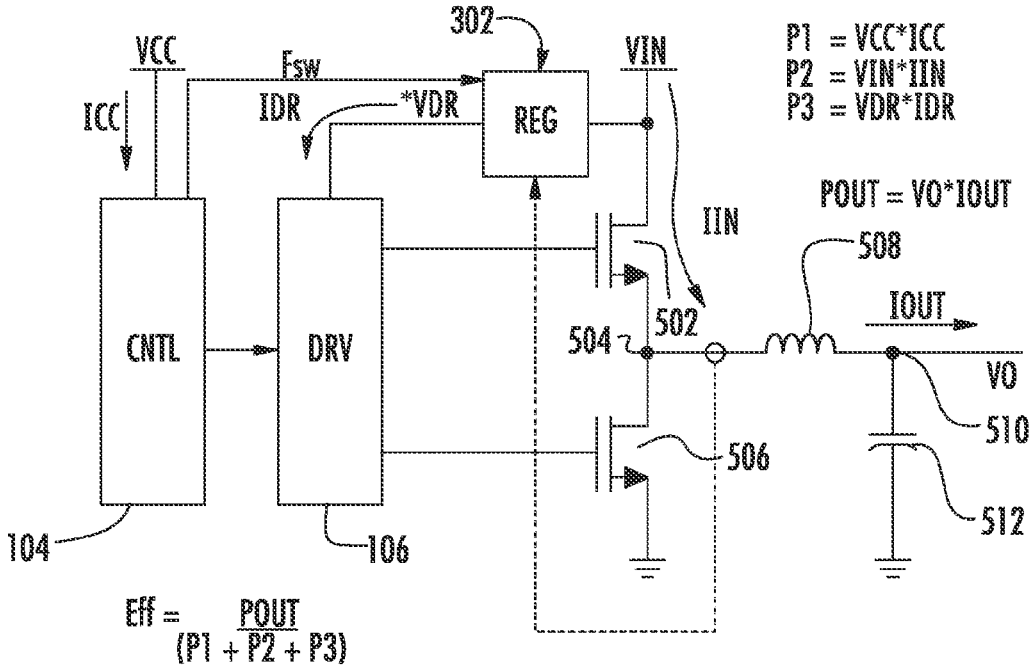
FIG. 5 is a schematic diagram of a buck type regulator.

Referring now to FIG. 5, there is illustrated an example of a power stage 108 comprising a buck type regulator circuit. A first transistor 502 has its drain/source path connected between $V_{in}$ and node 504. A second switching transistor 506 has its drain/source path connected between node 504 and ground. An inductor 508 is connected between node 504 and 510. A capacitor 512 is connected between node 510 and ground. The load current is measured at node 504 and this information is provided to the adaptive drive voltage supply 302 along with the switching frequency $F_{SW}$ from controller 104. The overall load efficiency of the circuit illustrated in FIG. 5 is based upon the following equation:

$$\text{Eff} = \frac{P_{out}}{P_1 \pm P_2 \pm P_3}$$

where $$P_{out} = V_0 \times I_{out}$$

$$P_1 = VCC \times ICC$$

$$P_1 = V_{in} \times I_n$$

$$P_3 = Vdr \times Idr$$

Thus, the value of Vdr provided to the driver circuit 106 may be altered such that the value of $P_3$ will change in the above equation. The value of $P_3$ may then be set based upon the determined load current through node 504 such that the efficiency of the DC to DC converter is provided at a maximum value over a range of load currents.

Figure 6:
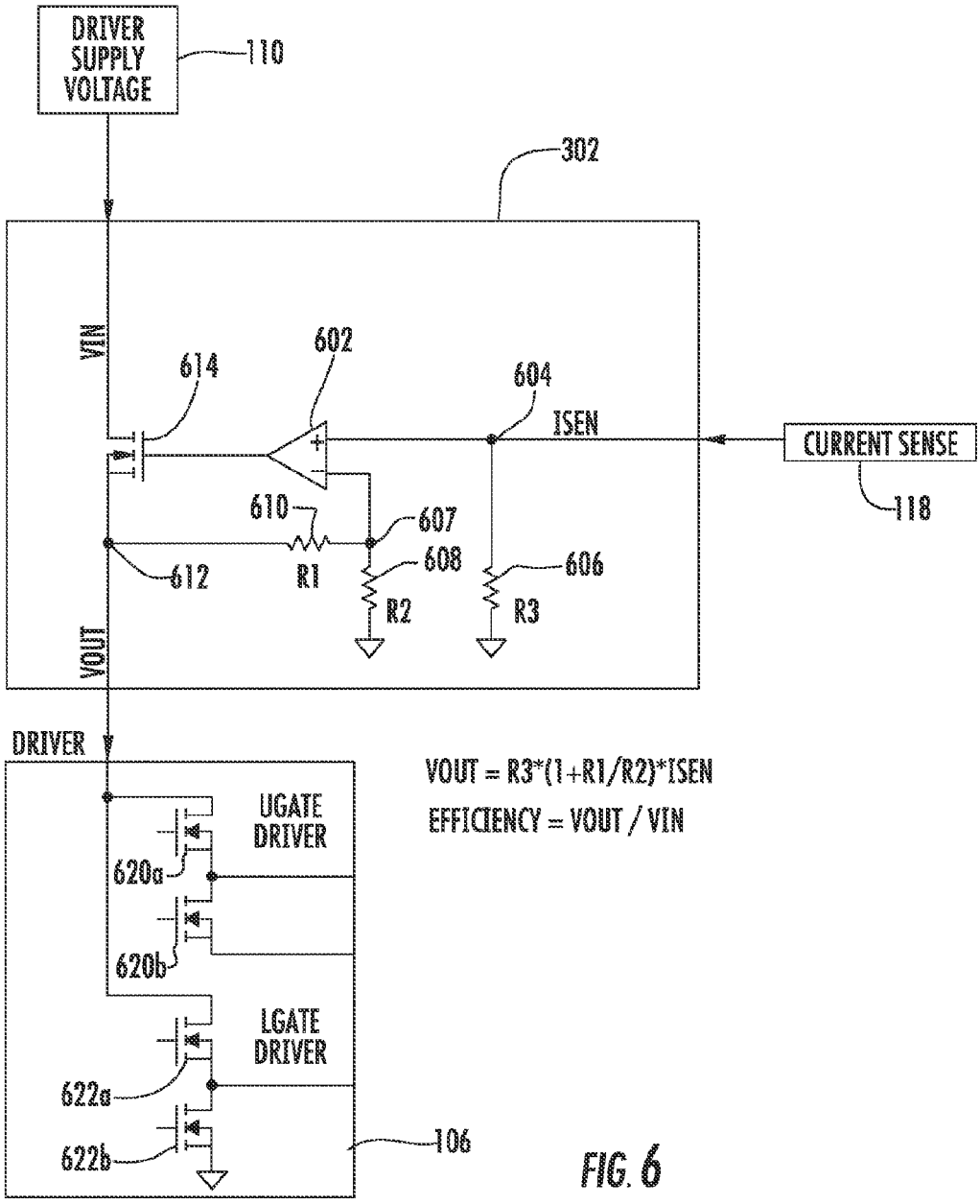
FIG. 6 is a schematic diagram of a first embodiment of the circuit of FIG. 3.
Figure 7:
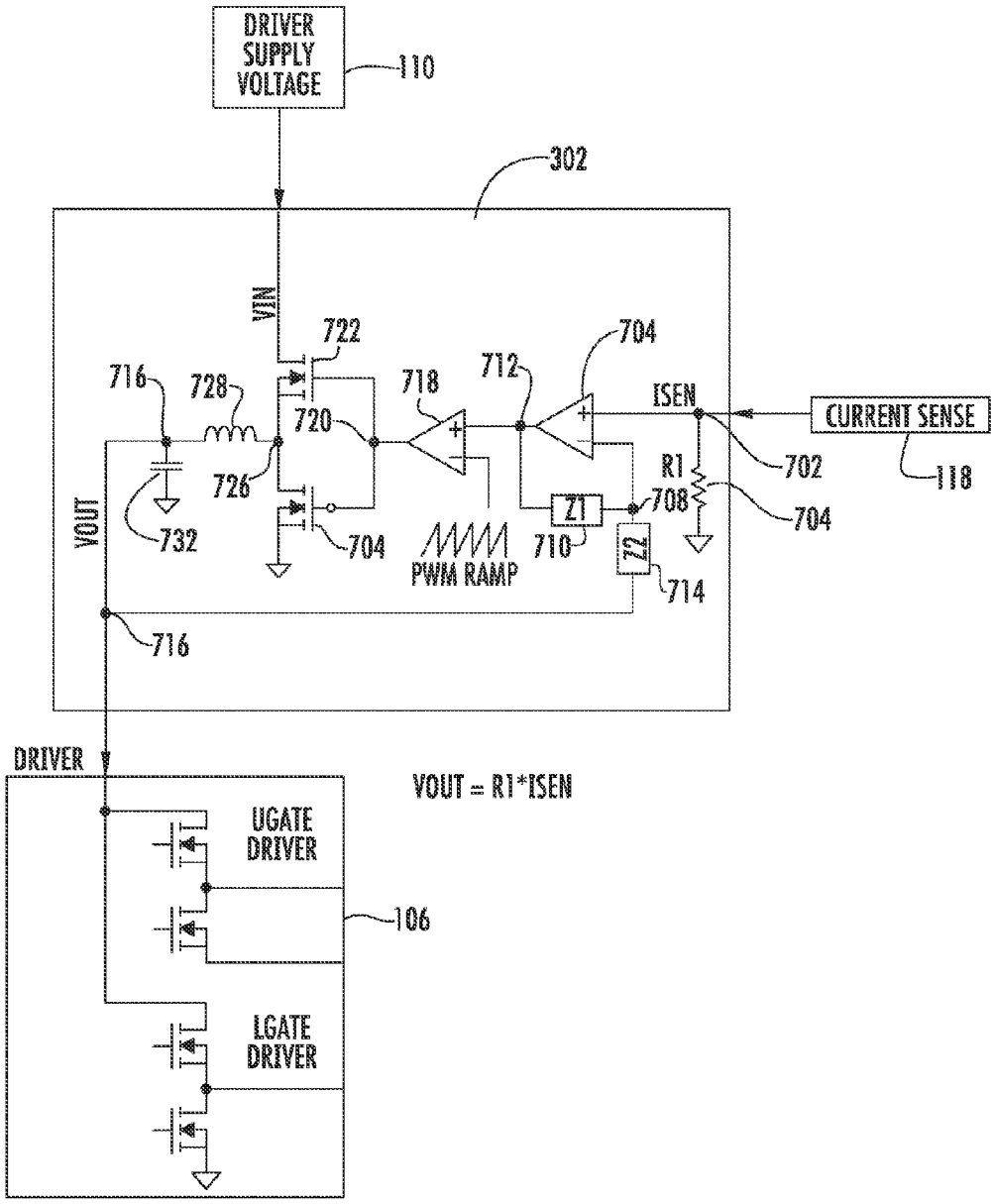
FIG. 7 illustrates a second embodiment of the circuit of FIG. 3.

Referring now to FIGS. 6-8, there are illustrated various embodiments of the adaptive drive voltage supply 302 according to the present disclosure. While the present examples provided in FIGS. 6-8 describe manners for generating a variable output voltage to maximize the load efficiency responses to a detected load current based upon measurements from a current sensor 118, the present invention envisions the use of the switching frequency in addition to the load current or the switching frequency alone also being used as an input variable to establish a variable output voltage to maximize load efficiencies within a switched power circuit.

In a first embodiment illustrated in FIG. 6, a series pass liner regulation configuration is used. The adaptive drive voltage supply 302 is connected to receive an input voltage $V_{in}$ from the driver supply voltage 110 as described herein above. The adaptive voltage supply 302 additionally receives a sensed current $I_{sen}$ from the current sensor 118. An OpAmp 602 has its positive input connected to receive the $I_{sen}$ signal at node 604. Also connected to node 604 is a resistor 606 which is also connected to ground. The negative input of OpAmp 602 is connected to a feedback network consisting of resistor 608 and 610. The negative input of OpAmp 602 is connected to node 607, and resistor 608 is connected between node 607 and ground. Resistor 610 is connected between node 607 and node 612. A transistor 614 has its drain/source path connected between the $V_{in}$ input to the adaptive drive voltage supply 302 and node 612. The gate of transistor 614 is connected to the output of comparator circuit 602. Node 612 provides the adjustable output voltage $V_{out}$ which is applied to the driver circuit 106. The output voltage of $V_{out}$ is provided to the drain of a first transistor 620 of a transistor pair which are the UGate driver transistors of the power stage 108. The adjustable voltage $V_{out}$ is also provided to the drain of a first transistor 622 of a pair of transistors driving the lower gate driver transistors of the power stage 108. The gates of these transistors 620 and 622 receive control signals from the controller 104.

This configuration represents, but is not limited to, a series pass linear regulator implementation. Any linear application that achieves the result of a current controlled voltage source for the purpose of varying gate drive voltage as a function of load current in switching power supply applications for overall improved system efficiency is implied by this implementation. The above described implementation provides an output voltage $V_{out}=R_3\times(1+R_1/R_2)\times I_{sen}$. Efficiency$=V_{out}/V_{in}$. Thus, the variable output drive voltage is controlled to vary linearly over an established ramp by selecting the appropriate values of $R_1$, $R_2$ and $R_3$.

Referring now to FIG. 7, there is illustrated a second embodiment of the adaptive drive voltage supply 302 providing a higher efficiency switching regulator implementation. This configuration is for use with a buck regulator implementation. However, any switching application that achieves the result of a current controlled voltage source with higher efficiency for the purpose of varying gate drive voltage as a function of low current switching power applications, or overall improved system efficiency may use a similar configuration. As described previously, the adaptive drive supply voltage 302 receives an input voltage $V_{in}$ from the driver supply voltage 110 and a current sense signal $I_{Sen}$ from the current sense circuitry 118. Additionally, the circuitry receives an input PWM ramp signal. The input current sense signal $I_{sen}$ is applied to an input node 702. A resistor 704 is connected between node 702 and ground. A OpAmp 706 has its positive input connected to the $I_{sen}$ node 702. The negative input of OpAmp 706 is connected to a feedback network at node 708. A first impedance 710 is connected between the output of the comparator 706 at node 712 and node 708. A second impedance 714 is connected between node 708 and 716. The output of the OpAmp 706 at node 712 is connected to a positive input of a second OpAmp 718. The negative input of OpAmp 718 is connected to receive the PWM ramp signal. The output of OpAmp 718 is connected at node 720 to the gates of transistors 722 and 724. The drain/source path of n-type transistor 722 is connected between the input node receiving the adjustable input voltage $V_{in}$ and node 726. The second p-type transistor 724 has its drain/source path connected between node 726 and ground. An inductor 728 is connected between node 726 and node 716. A capacitor 732 is connected between node 716 and ground. Node 716 provides the adjustable output voltage of $V_{out}$ to a drain of a first transistor 620a. The output voltage of $V_{out}$ is provided to the drain of a first transistor 620 of a transistor pair which are the UGate driver transistors of the power stage 108. The adjustable voltage $V_{out}$ is also provided to the drain of a first transistor 622 of a pair of transistors driving the lower gates of the power stage 108. The gates of these transistors 620 and 622 receive control signals from the controller 104. The variable output voltage of the device is controlled by setting resistor $R_1$ and impedances $Z_1$ and $Z_2$ to appropriate values.

Figure 8A:
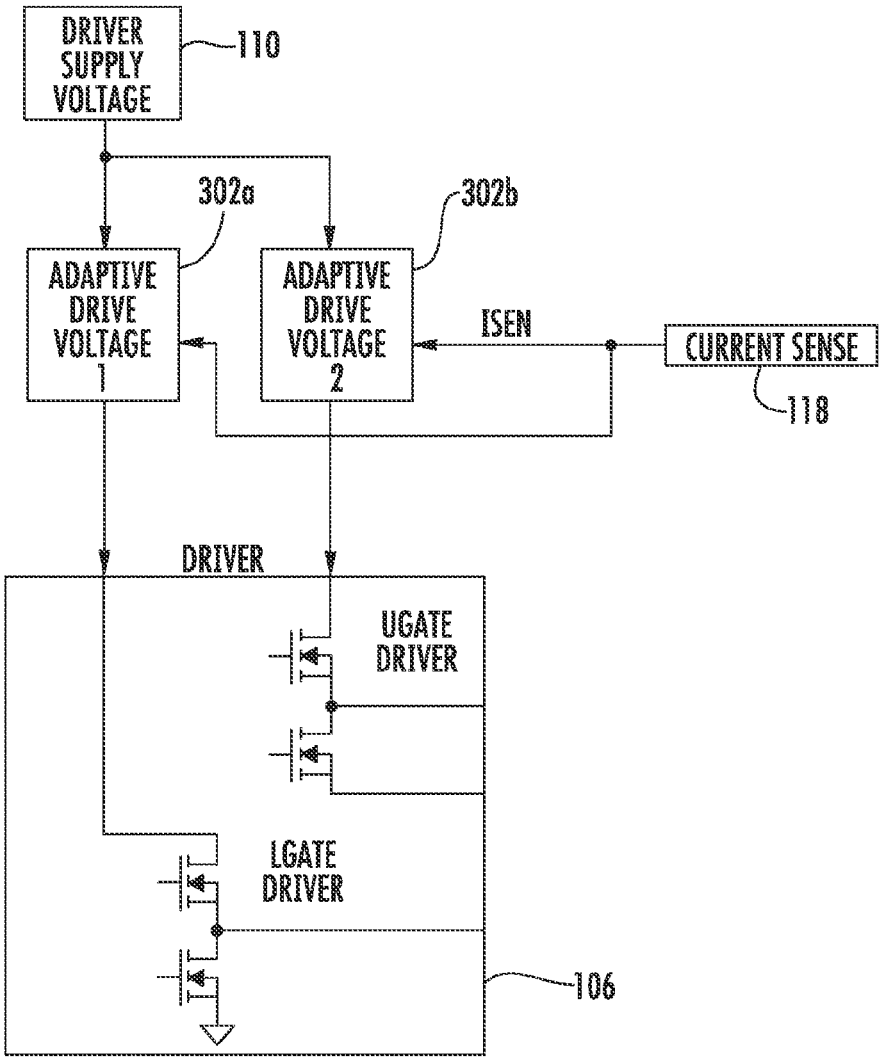
FIG. 8a illustrates a third embodiment of the circuit of FIG. 3.

Referring now to FIG. 8a, there is illustrated a further embodiment for an adaptive drive voltage supply 302 which provides multiple gate drive voltages to the driver circuit 106. This configuration includes a first adaptive drive voltage supply 302a and a second adaptive voltage supply 302b. Each of the adaptive voltage supplies 302 are supplied a voltage from the driver supply voltage 110 and receive a sensed current signal $I_{sen}$ from the current sense circuit 118. The adaptive drive voltage supply blocks 302 may comprise either of the two embodiments illustrated in FIGS. 6 and 7, respectively, or even may use other configurations. Each adaptive drive voltage supply blocks 302 can be programmed independently to provide two different variable output voltages to further improve the efficiency of the DC to DC power converter. The adaptive drive voltage supply block 302a supplies an adjustable voltage to the drain of a first transistor 622a of a lower transistor pair driving the lower gates of the power stage circuitry 108. The adjustable voltage provided from adaptor drive voltage supply 302b is provided to the drain of an upper transistor 620a of a pair of transistors driving the upper gate transistors of the switched power supply 108. As before, the gates of the transistors in the driver circuit 106 receive switching control signals from the controller 104.

Figure 8B:
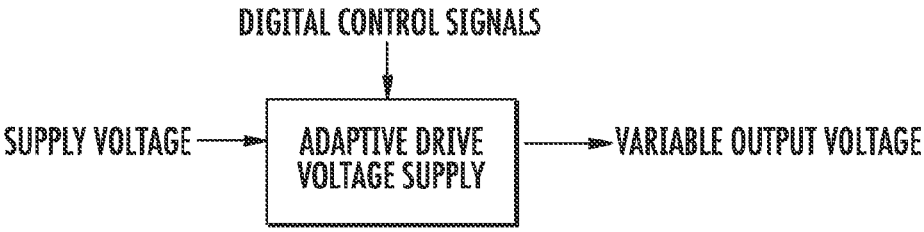
FIG. 8b illustrates a digitally controlled adaptive drive voltage supply.

In addition to using an analog implementation that uses the resistor and impedance network to program the variable voltage output, digital control signals may be generated to control the variable output voltage using any number of digital circuit configurations as illustrated in FIG. 8b.

Using the input voltage $V_{IN}$ to output load current $I_{OUT}/I_L$ and the switching frequency $F_{SW}$, the drive voltage may be controlled. This analysis attempts to derive an efficiency optimized Vgs as a function of output load, to minimize the sum of driver switching loss and FET losses related to Rdson.

Using the datasheet for the Infineon BSC022N03S Power MOS, the Rdson vs. Vgs data is linearized for 5V<Vgs<10V, whereby the factor Kr defines the linearized rate of change. Similarly, Kg is defined as the rate of change of Qg for a given change in Vgs.

The power loss for the driver and the FET is given by the equation:

$$Ptotal=(Qg\times Vgs\times fsw)+(Rdson\times Iout^2)$$

Finding dPtotal(Vgs)/dVgs and setting it to ZERO will yield the minimum Ptotal(Vgs).

Using the linearized substitutions:

$$Rdson=-Kr\times\Delta Vgs$$

$$Qg=Kg\times\Delta Vgs$$

Ptotal(Vgs) and dPtotal(Vgs)/dVgs are derived, yielding:

$$2KgVgsfs-KrIout^2=0$$

By isolating Vgs:

$$Vgs=(Kr\times Iout\hat{}2)/(2\times Kg\times fs)$$

Figure 9:
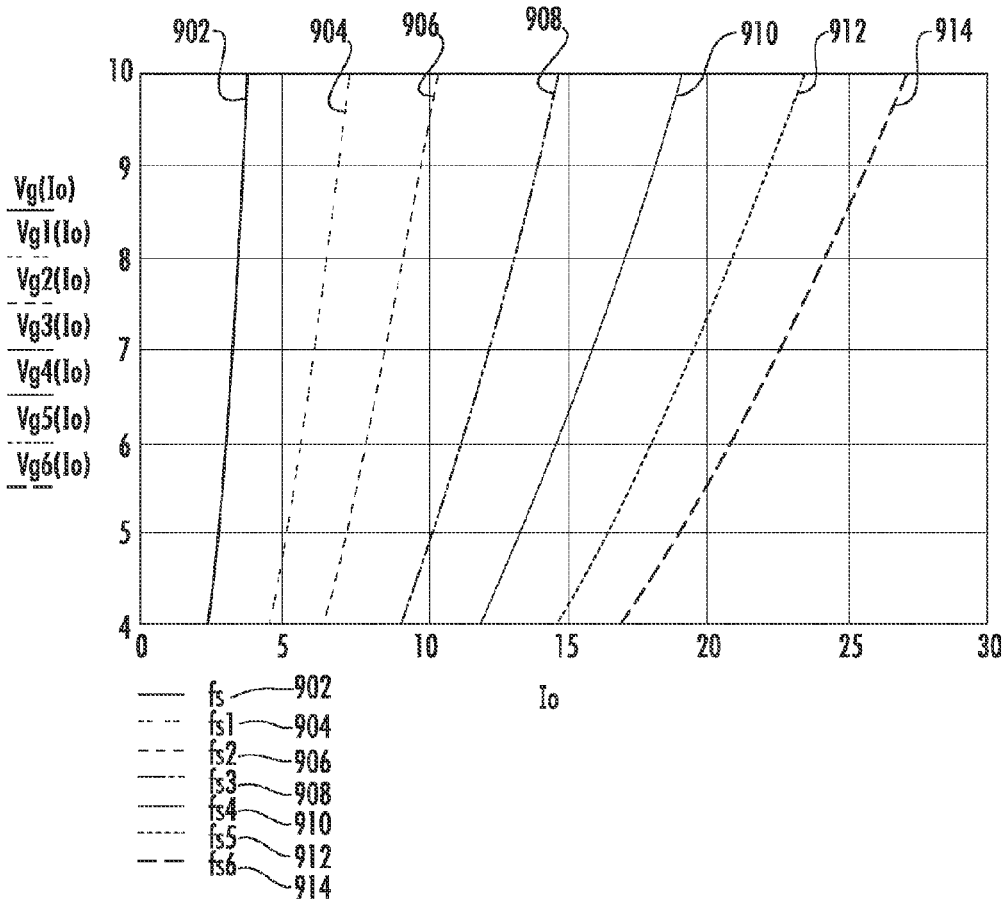
FIG. 9 illustrates load amount versus drive voltage for various frequencies.

Plotting Vgs(Iout) within a realistic range of Iout, and for various frequencies (20K, 75K, 150K, 300K, 500K, 750K, and 1M), the results illustrated in FIG. 9 are provided. Intuitively, for the non linear portion of Rdson that falls in the range 3V<Vgs<5V, all curves will converge to the FET threshold voltage.

$$dVgx := 5$$

$$dRs := 1.1\cdot 10^{-3}$$

$$Kr := \frac{dRds}{dVgs}$$

$$dQg := 40\cdot 10^{-9}$$

$$Kg := \frac{dQg}{dVgs}$$

$$fs := 20000$$

$$fs1 := 75000$$

$$fs2 := 150000$$

$$fs3 := 300000$$

-continued $$fs4 := 500000$$

$$fs5 := 750000$$

$$fs6 := 1000000$$

$$Vg1(Io) := \frac{Kr}{2 \cdot Kg \cdot fs} Io^2$$

$$Vg2(Io) := \frac{Kr}{2 \cdot Kg \cdot fs2} Io^2$$

$$Vg3(Io) := \frac{Kr}{2 \cdot Kg \cdot fs3} Io^2$$

$$Vg4(Io) := \frac{Kr}{2 \cdot Kg \cdot fs4} Io^2$$

$$Vg5(Io) := \frac{Kr}{2 \cdot Kg \cdot fs5} Io^2$$

$$Vg6(Io) := \frac{Kr}{2 \cdot Kg \cdot fs6} Io^2$$

A more accurate plot can be derived by curve fitting a set of data from a matrix to a polynomial function to derive Rds (Vgs) that would hold true from Vth to the upper limit of Vgs.

Additionally, thermal compensation will ensure that the Vgs applied will continue to yield minimum power loss, as Rds changes with T.

Additional detailed analysis may be required to quantify the merits, such as the efficiency gains, as well as the added complexity of creating a variable voltage rail, in the near future.

It will be appreciated by those skilled in the art having the benefit of this disclosure that this invention provides a gate driver topology providing improved load efficiency. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A DC to DC converter circuit, comprising:

a power stage for generating a *regulated* DC *output* voltage responsive to drive signals;

a driver circuit for generating the drive signals for power transistors in the power stage responsive to an adjustable supply voltage and drive control signals;

a controller for generating the drive control signals to the driver circuit responsive to [a sensed current signal] *at least the regulated DC output voltage*;

a current sensor for generating [the] *a* sensed current signal responsive to a sensed current in the power stage;

an adaptive drive voltage supply responsive to a supply voltage, the sensed current signal and a switching frequency of the power transistors in the power stage for generating the adjustable supply voltage.

2. The DC to DC converter circuit of claim 1, wherein the current sensor senses a load current of the power stage.

3. The DC to DC converter circuit of claim 2, wherein the adaptive drive voltage supply varies the adjustable supply voltage responsive to the sensed load current to improve an efficiency of the DC to DC converter circuit over a wide range of load currents.

4. The DC to DC converter circuit of claim 1, wherein the adaptive drive voltage supply adjusts the adjustable supply voltage responsive to a digital control signal.

5. The DC to DC converter circuit of the claim 1, wherein the adaptive drive voltage supply comprises a linear voltage regulator responsive to the supply voltage and the sensed current signal to linearly adjust the adjustable supply voltage between a first voltage responsive to a first sensed current signal and a second voltage responsive to a second sensed current signal.

6. The DC to DC converter circuit of claim 1, wherein the adaptive drive voltage supply comprises a switching voltage regulator responsive to the supply voltage and the sensed current signal to adjust the adjustable supply voltage.

7. The DC to DC converter circuit of claim 1, wherein the adaptive drive voltage supply comprises a plurality of adaptive drive voltage supplies, each of the plurality of adaptive drive voltage supplies providing a different adjustable supply voltage for a portion of the power transistors of the power stage.

8. A DC to DC converter circuit, comprising:

a power stage for generating a *regulated* DC *output* voltage responsive to drive signals;

a driver circuit for generating the drive signals for power transistors in the power stage responsive to an adjustable supply voltage and drive control signals;

a controller for generating the drive control signals to the driver circuit responsive to [a sensed current signal] *at least the regulated DC output voltage*;

a current sensor for generating [the] *a* sensed current signal responsive to a sensed current in the power stage;

an adaptive drive voltage supply responsive to a supply voltage and the sensed current signal for generating the adjustable supply voltage, wherein the adaptive drive voltage supply comprises a plurality of adaptive drive voltage supplies, each of the plurality of adaptive drive voltage supplies providing a different adjustable supply voltage for a portion of the power transistors of the power stage.

9. The DC to DC converter circuit of claim 8, wherein the adaptive drive voltage supply adjusts the adjustable supply voltage responsive to a digital control signal.

10. The DC to DC converter circuit of claim 8, wherein the current sensor senses a load current of the power stage.

11. The DC to DC converter circuit of claim 10, wherein the adaptive drive voltage supply varies the adjustable supply voltage responsive to the sensed load current to improve an efficiency of the DC to DC converter circuit over a wide range of load currents.

12. The DC to DC converter circuit of claim 8, wherein the adaptive drive voltage supply is further responsive to a switching frequency of the power transistors in the power stage.

13. The DC to DC converter circuit of [the] claim 8, wherein the adaptive drive voltage supply comprises a linear voltage regulator responsive to the supply voltage and the sensed current signal to linearly adjust the adjustable supply voltage between a first voltage responsive to a first sensed current signal and a second voltage responsive to a second sensed current signal.

14. The DC to DC converter circuit of claim 8, wherein the adaptive drive voltage supply comprises a switching voltage regulator responsive to the supply voltage and the sensed current signal to adjust the adjustable supply voltage.

15. A DC to DC converter circuit, comprising:

a power stage for generating a *regulated* DC *output* voltage responsive to drive signals;

a driver circuit for generating the drive signals for power transistors in the power stage responsive to an adjustable supply voltage and drive control signals;

a controller for generating the drive control signals to the driver circuit responsive to [a sensed current signal] *at least the regulated DC output voltage*;

a current sensor for generating [the] *a* sensed current signal responsive to a sensed current in the power stage;

an adaptive drive voltage supply responsive to a supply voltage and the sensed current signal for generating the adjustable supply voltage, wherein the adaptive drive voltage supply adjusts the adjustable supply voltage responsive to a digital control signal.

16. The DC to DC converter circuit of claim 15, wherein the current sensor senses a load current of the power stage.

17. The DC to DC converter circuit of the claim 16, wherein the adaptive drive voltage supply comprises a linear voltage regulator responsive to the supply voltage and the sensed current signal to linearly adjust the adjustable supply voltage between a first voltage responsive to a first sensed current signal and a second voltage responsive to a second sensed current signal.

18. The DC to DC converter circuit of claim 16, wherein the adaptive drive voltage supply varies the adjustable supply voltage responsive to the sensed load current to improve an efficiency of the DC to DC converter circuit over a wide range of load currents.

19. The DC to DC converter circuit of claim 16, wherein the adaptive drive voltage supply is further responsive to a switching frequency of the power transistors in the power stage.

* * * * *